(12) United States Patent
Taylor

(10) Patent No.: US 11,854,651 B2
(45) Date of Patent: Dec. 26, 2023

(54) SYSTEMS AND METHODS FOR IMPROVED DUAL-TAIL LATCH WITH WIDE INPUT COMMON MODE RANGE

(71) Applicant: Micron Technology, Inc., Boise, ID (US)

(72) Inventor: Jennifer E. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 17/677,628

(22) Filed: Feb. 22, 2022

(65) Prior Publication Data
US 2023/0267971 A1 Aug. 24, 2023

(51) Int. Cl.
| | |
|---|---|
| *G11C 7/06* | (2006.01) |
| *G11C 7/10* | (2006.01) |
| *H03K 3/356* | (2006.01) |
| *G11C 11/4091* | (2006.01) |
| *G11C 11/4093* | (2006.01) |

(52) U.S. Cl.
CPC .............. *G11C 7/065* (2013.01); *G11C 7/106* (2013.01); *G11C 7/1087* (2013.01); *G11C 11/4091* (2013.01); *G11C 11/4093* (2013.01); *H03K 3/356139* (2013.01)

(58) Field of Classification Search
CPC ....... G11C 7/065; G11C 7/106; G11C 7/1087; G11C 11/4091

USPC ...................................................... 365/189.05
See application file for complete search history.

(56) References Cited

U.S. PATENT DOCUMENTS

| | | | |
|---|---|---|---|
| 8,467,255 B2* | 6/2013 | Kim ..................... | G11C 7/1084 |
| | | | 365/189.16 |
| 10,291,439 B1* | 5/2019 | Taylor .................. | G11C 7/1048 |
| 11,037,607 B2 | 6/2021 | Chong et al. | |

* cited by examiner

*Primary Examiner* — Connie C Yoha
(74) *Attorney, Agent, or Firm* — Fletcher Yoder, P.C.

(57) ABSTRACT

A memory device including an interface to receive one or more clock signals and one or more data signal a dual-sensing stage dual-tail latch arranged at the interface. The dual-sensing stage dual-tail latch includes a sensing stage to sense a differential voltage between a first signal and a second signal and to provide a first differential voltage output and a second differential voltage output to a first node and a second node, respectively. The dual-sensing stage dual-tail latch includes a complimentary sensing stage arranged in parallel with the sensing stage and to sense the differential voltage between the first signal and the second signal, where a first complimentary differential output voltage and a second complimentary differential output of the complimentary sensing stage are coupled to the first node and the second node. The dual-sensing stage dual-tail latch includes a latch stage to receive the outputs from the first node and the second node.

20 Claims, 4 Drawing Sheets

SYSTEMS AND METHODS FOR IMPROVED DUAL-TAIL LATCH WITH WIDE INPUT COMMON MODE RANGE

BACKGROUND

Field of the Present Disclosure

Embodiments of the present disclosure relate generally to the field of semiconductor devices. More specifically, embodiments of the present disclosure relate to dual-tail latches in a memory device.

Description of Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Semiconductor devices (e.g., memory devices) may use a combination of a comparator or sensing stage and a latch stage (e.g., a dual-tail latch) to latch signals without additional electronic components. The dual-tail latch may be implemented with n-type input transistors or p-type input transistors, allowing for sensing of different voltage levels within a wide common mode range. However, conventional dual-tail latches with either n-type input transistors or p-type input transistors at both stages of the dual-tail latch may have difficulties in sensing and latching data in systems with wide input swings (e.g., rail-to-rail) as the input transistors may be operating in the cut-off region. That is, in certain applications, usage of traditional dual-tail latch architectures may result in distortion of the data eye, reduced rank margining tool (RMT) margin and difficulties in decision feedback equalization (DFE) training, as input transistors operate in the cut-off region. As such, systems implementing an improved dual-tail latch may be desired.

Embodiments of the present disclosure may be directed to address one or more of the problems set forth above.

BRIEF DESCRIPTION OF DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices receive signals having varying voltage levels during operation and may latch incoming signals within the receiver. Each signal may have a voltage level located in the common mode range, and each signal may be amplified to be processed in the memory device. To mitigate the need for additional electronic components (e.g., operational amplifiers), a dual-tail latch with a sensing stage, for comparing and amplifying input signals, and a latching stage, for latching the output signals from the sensing stage, may be implemented with input transistors of each stage having a common transistor type (e.g., either n-type transistors or p-type transistors) employed as input transistors in each stage. This may allow for sensing of different voltage levels within a wide common mode range.

However, when implementing the dual-tail latch with either n-type input transistors or p-type input transistors as the inputs of the sensing stage and the latching stage, the dual-tail latch may encounter difficulties in reliably sensing and latching the inputs, particularly in applications with wide input voltage swings (e.g., rail-to-rail), where significant margin loss may be observed. Embodiments disclosed herein provide systems for implementing a second sensing stage within the dual-tail latch to ensure proper capture of the input signals, even for signals over a wide input common mode range. As described below, the second sensing stage is parallel to the first sensing stage and employs complimentary input elements (e.g., transistors) compared to the first sensing stage, to provide improved performance by producing a larger, more symmetric data eye compared to a dual-tail latch having only a single sensing stage.

Figure 1:
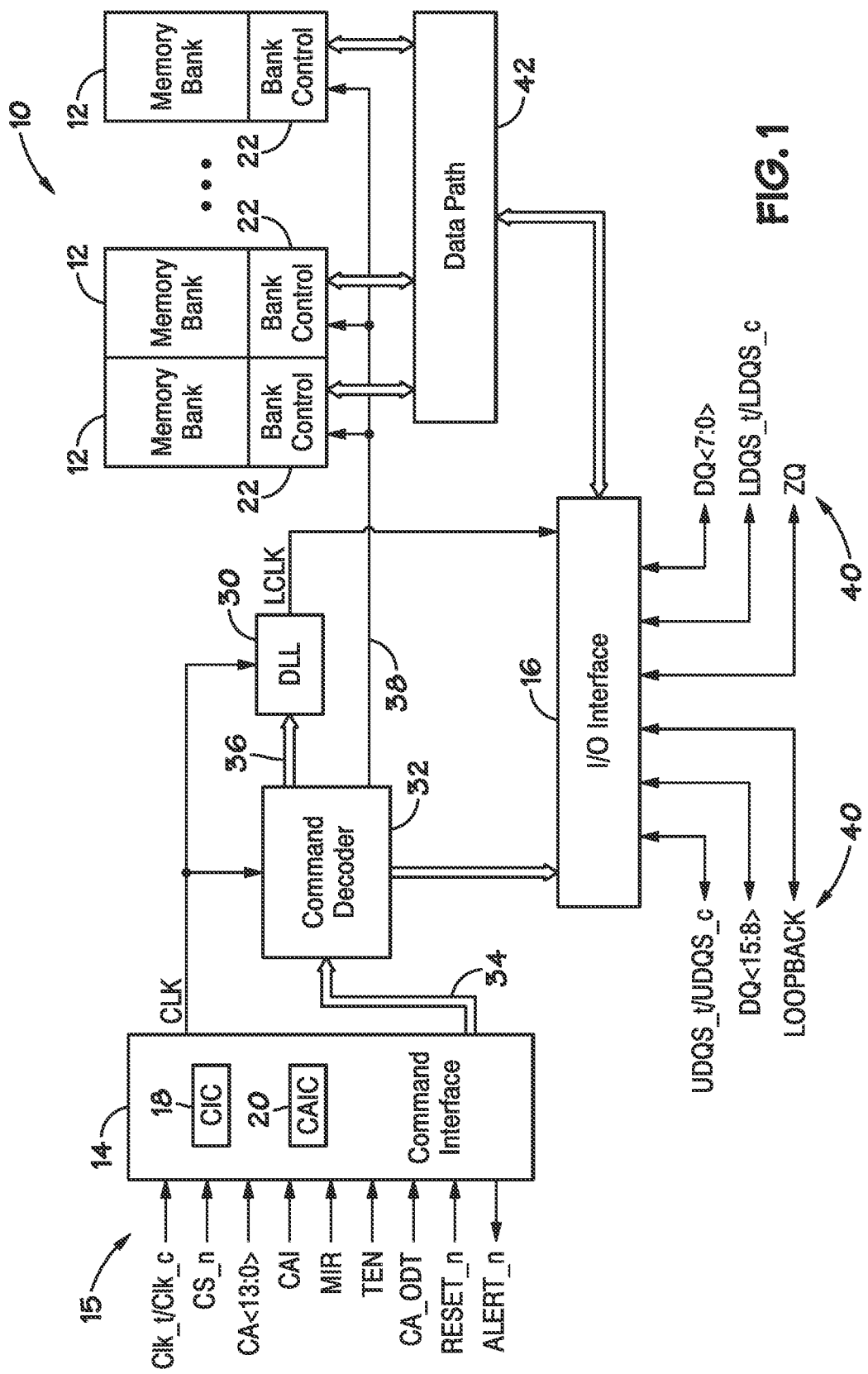
FIG. 1 is a simplified block diagram illustrating some features of a memory device, according to an embodiment of the disclosure.

FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device 10, such as decoding, timing control, data control, and any combination thereof.

A command interface 14 of the memory device 10 is configured to receive and transmit a number of signals (e.g., signals 15). The signals 15 may be received from an external device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). A positive clock edge for DDR refers to the point where a rising true clock signal Clk_t crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 18 receives the true clock signal (Clk_t) and the bar clock signal (Clk_c) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to an I/O interface 16, for instance, and is used as a timing signal for determining an output timing of read data. In some embodiments, as discussed below, the clock input circuit 18 may include circuitry that splits the clock signal into multiple (e.g., four) phases. The clock input circuit 18 may also include phase detection circuitry to detect which phase receives a first pulse when sets of pulses occur too frequently to enable the clock input circuit 18 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode incoming commands, such as read commands, write commands, mode-register set commands, activate commands, etc., and provide access to a particular memory bank 12 corresponding to the command via the bus path 38. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus 34 may be a 14-bit bus to accommodate the command/address signals (CA<13:0>). The command/address signals 15 are clocked to the command interface 14 using the clock signals (Clk_t and Clk_c). The command interface 14 may include a command address input circuit 20 which is configured to receive and transmit the commands to provide access to the memory banks 12 through the command decoder 32. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus 34, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 40 through the I/O interface 16. More specifically, the data may be sent to or retrieved from the memory banks 12 over a datapath 42, which includes a plurality of bi-directional data buses. Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description.

As discussed above, the memory device may receive input signals at the I/O interface 16 to execute one or more commands. Before execution of the one or more commands based on the input signals, the memory device may latch the input signals in the I/O interface 16. To latch the input signals, the memory device may use a dual-tail latch to sense/amplify and latch the input signals without the addition of additional electronic components.

Figure 2:
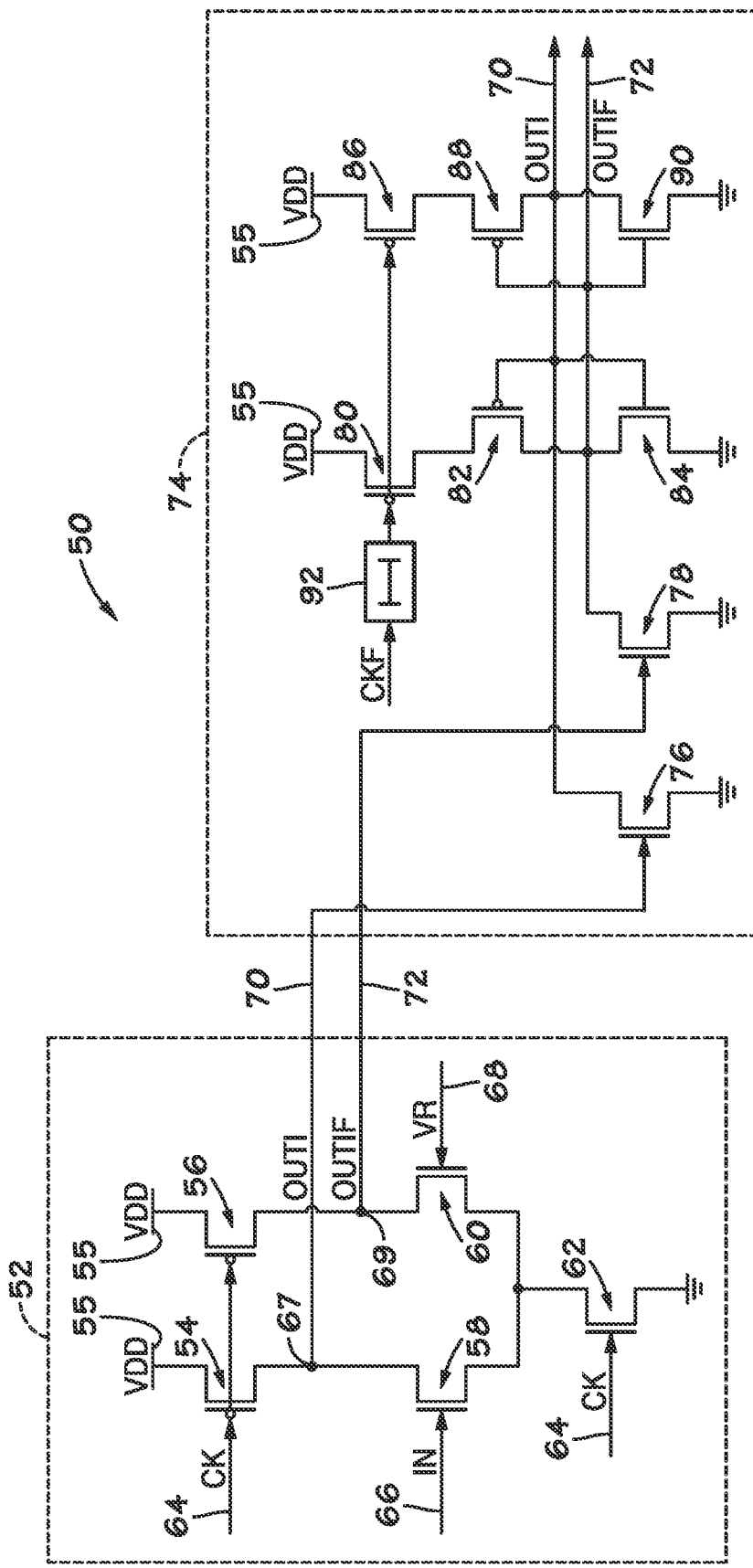
FIG. 2 is a circuit diagram of a dual-tail latch with n-type transistors.

With the foregoing in mind, FIG. 2 is a circuit diagram of a dual-tail latch 50 with n-type input transistors. The dual-tail latch may be located in the I/O interface 16 in the memory device 10, for instance. The dual-tail latch 50 may include a comparator or sensing stage 52 and a latch stage 74. The sensing stage 52 includes transistors (e.g., MOSFET transistors) 54, 56, 58, 60, and 62. In particular, the input transistors 58 and 60 and the transistor 62 may be n-type transistors. Furthermore, the transistors 54 and 56 may be p-type transistors. A clock signal CK (e.g., LCLK) 64 may be connected to a gate of the transistors 54, 56, and 62 to clock the signals receive by the input transistors 58 and 60 to sense and amplify one or more signals at the sensing stage 52. For instance, a DQ input signal 66 (e.g., DQ<15:8>/DQ<7:0>) may be connected to a gate of the input transistor 58. A voltage reference 68 may be connected to a gate of the input transistor 60. Additionally, voltage source (VDD) 55 may be coupled to a source of the transistors 54 and 56.

The latch stage 74 includes transistors (e.g., MOSFET transistors) 76, 78, 80, 82, 84, 86, 88, and 90. In particular, transistors 76, 78, 84, and 90 may be n-type transistors. Furthermore, transistors 80, 82, 86, and 88 may be p-type transistors. An inverted clock signal CKF (e.g., an inverted version of the clock signal CK 64 or LCLK) may be connected to a gate of the transistors 80 and 86. A delay element 92 may be provided to ensure proper timing based on propagation delays. Additionally, voltage source (VDD) 55 may be coupled to a source of the transistors 80 and 86. When the clock signal 64 is low, the transistors 62 is off and the voltage at nodes 67 and 69, respectively, is reset and pre-charged to be equivalent to VDD 55 through transistors 54 and 56. That is, the sensing stage 52 may be in a pre-charging phase.

When the clock signal 64 is high, the transistors 54 and 56 are turned off and the transistors 58, 60, and 62 are turned on. The transistors 58 and 60 draw a differential current proportional to the potential difference between the voltage of the DQ input signal 66 and the voltage reference 68. The differential current flow due to the discharge of voltage allows the differential voltage between the node 67 and the node 69 to increase (e.g., differential gain) relative to the differential voltage between the DQ input signal 66 voltage and the voltage reference 68. That is, the differential voltage is amplified and discharges the voltages at nodes 67 and 69 to VSS. As the nodes 67 and 69 continue to discharge, the transistors 76 and 78 are switched on.

The differential voltage is built up through the transistors 76 and 78 and passes to the transistors 82, 84, 88, and 90. The transistors 82, 84, 88, and 90 are regenerative circuits, creating a full rail (e.g., digital ready) output representative of the amplified DQ input signal 66. That is, it is not necessary to buffer the signal and wait for an increase in gain before the output is passed to the rest of the circuit.

While the dual-tail latch 50 is able to provide full rail output without any additional operational amplifiers, the dual-tail latch 50 may encounter difficulty with a DQ input signal 66 voltage with a wide input swing (e.g., 100 millivolts (mV) to 900 mV) due to the limited common mode when only one pair of input transistors are present (e.g., n-type transistors or p-type transistors). Additionally, this may be a result of the transistors 58 and 60 being the same type of transistor (e.g., n-type transistor or p-type transistor) as the transistors 76 and 78 in the latch 74. To remedy the issues accolated with the wide input swing, a complimentary sensing stage may be added to cover the wide input swing of the DQ input signal 66 voltage, in accordance with the embodiments described herein.

Figure 3:
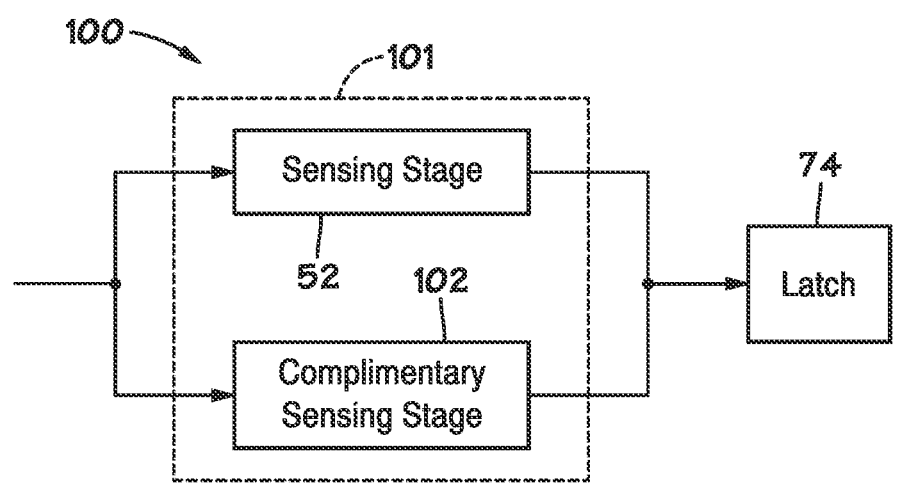
FIG. 3 is a block diagram of an improved dual-tail latch, according to an embodiment of the disclosure.

With the foregoing in mind, FIG. 3 is a block diagram of a modified dual-tail latch 100 with a dual-component sensing stage 101 and the latch stage 74, in accordance with the present embodiments. As used herein, the modified dual-tail latch 100 having a dual-component sensing stage 101 may also be referred to as a "dual-sensing stage dual-tail latch 100." As discussed above, the dual-tail latch 50 may encounter difficulty with the DQ input signal 66 with a wide input swing. In accordance with the improved embodiments, the dual-component sensing stage 101 may include the sensing stage 52 and a complimentary sensing stage 102. The complimentary sensing stage 102 may be provided in parallel with the sensing stage 52 to compensate for the wide input swing of the incoming DQ input signal 66. That is, the complimentary sensing stage 102 may include input transistors of an opposite type (e.g., n-type transistors or p-type transistors) of the input transistors 58 and 60, as well as the remaining transistors of the sensing stage 52. The outputs of each sensing stage 52 and 102 are coupled together and provided as inputs to the latch stage 74. Furthermore, the sensing stage 52 and the complimentary sensing stage 102 may be clocked with the same CK signal 64. Alternatively, the complimentary sensing stage 102 may be constructed with some delay, depending on device characteristics.

In this way, the modified dual-tail latch 100 may accurately sense and latch incoming DQ input signals 66 with a wide input swing. The sensing stage 52 and complimentary sensing stage 102 may each receive the DQ input signal 66 and the voltage reference 68. The sensing stage 52 and the complimentary sensing stage 102 senses the DQ input signal 66 and compares the DQ input signal 66 with the voltage reference 68. Based on the voltage level of the DQ input signal 66 and the transistor types (e.g., n-type transistor or p-type transistor) of the sensing stage 52 and the complimentary sensing stage 102, the sensing stage 52 or the complimentary sensing stage 102 amplifies the DQ input signal 66 and transmits the amplified signal to the latch 74. The latch 74 may latch (e.g., hold) the amplified signal.

Figure 4:
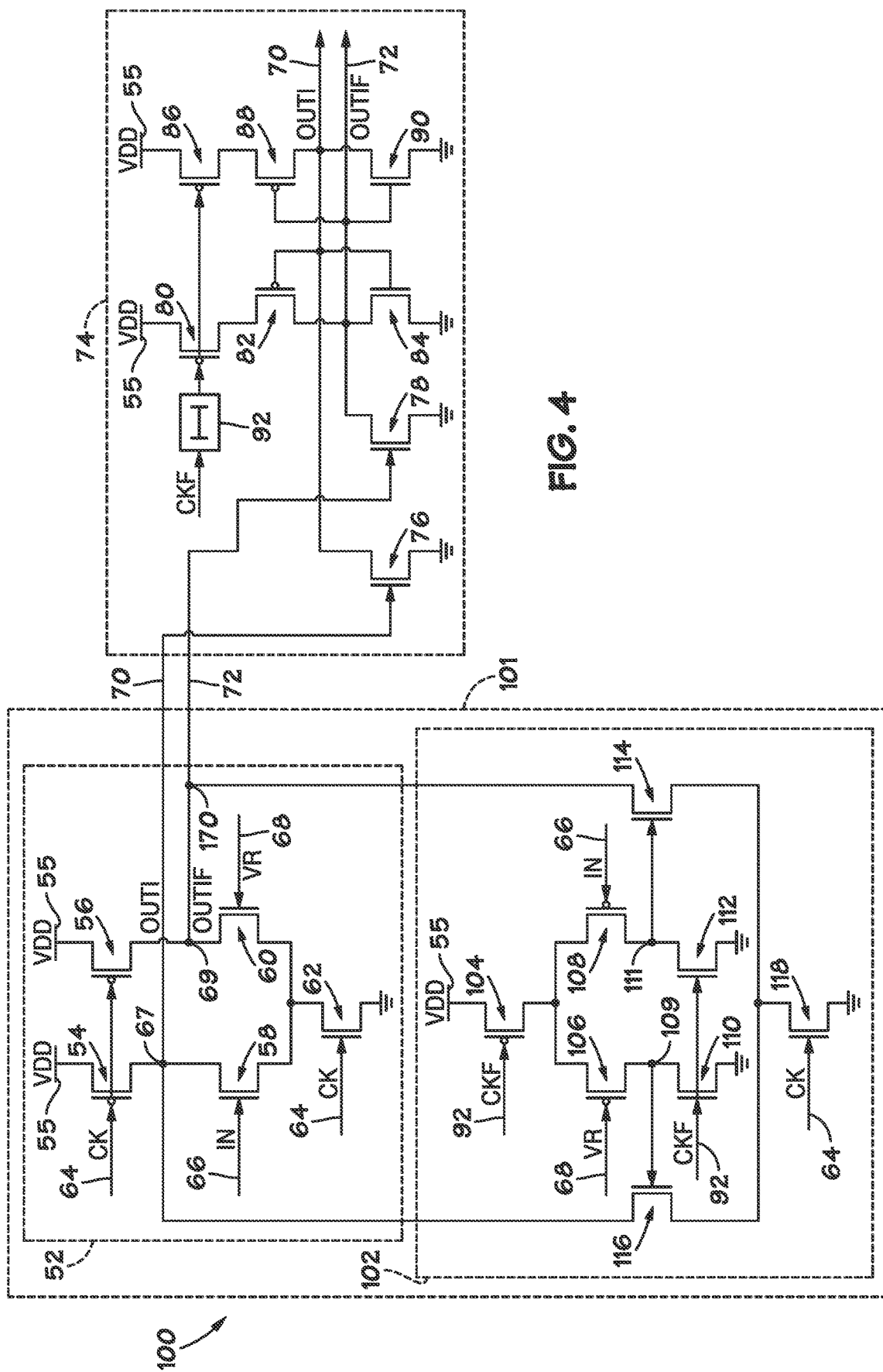
FIG. 4 is a circuit diagram of the improved dual-tail latch of FIG. 3, according to an embodiment of the disclosure.

With the foregoing in mind, FIG. 4 is a circuit diagram of the modified dual-tail latch 100 with the dual-component sensing stage 101 and the latch stage 74 of FIG. 3. The modified dual-tail latch 100 may be located in the I/O interface 16 in the memory device 10. Additionally, the dual-component sensing stage 101 may include the sensing stage 52 and the complimentary sensing stage 102. The sensing stage 52 includes the transistors (e.g., MOSFET transistors) 54, 56, 58, 60, and 62. In particular, the transistors 58, 60, and 62 may be n-type transistors. Furthermore, the transistors 54 and 56 may be p-type transistors. The clock signal CK (e.g., LCLK) 64 may be connected to a gate of the transistors 54, 56, and 62 to sense and amplify one or more signals in the sensing stage 52. For instance, the DQ input signal 66 (e.g., DQ<15:8> and DQ<7:0>) may be connected to a gate of the transistor 58. The voltage reference 68 may be connected to a gate of the transistor 60. Additionally, the voltage source (VDD) 55 may be coupled to a source of the transistors 54 and 56.

The complimentary sensing stage 102 includes transistors 104, 106, 108, 110, 112, 114, 116, and 118. In particular, the transistors 110, 112, 114, 116, and 118 may be n-type transistors. Furthermore, the complimentary input transistors 106 and 108 may be p-type transistors. That is, the input transistors 106 and 108 of the complimentary sensing stage 102 are of a type (e.g., p-type) that is complimentary to the input transistors 58 and 60 of the sensing stage 52 (e.g., n-type). The inverted clock signal CKF (e.g., the inversion of LCLK) may be connected to a gate of the transistors 104, 110, and 112. The clock signal CK 64 may be connected to a gate of the transistor 118 to clock the input signals to sense and amplify one or more signals at the complimentary sensing stage 102 (e.g., signals 66 and 68). The DQ input signal 66 may be connected to a gate of the transistor 108 and the voltage reference 68 may be connected to a gate of the transistor 106. Additionally, the voltage source (VDD) may be coupled to a source of the transistors 104. It should be noted that the complimentary sensing stage 102 operates in parallel with the sensing stage 52. That is, the outputs of the sensing stage 52 and complimentary sensing stage 102 are coupled together (e.g., at node 67 and at node 69/170). It should be noted that in some embodiments, the positioning of the sensing stage 52 and the complimentary sensing stage 102 may be reversed.

As previously described, the latch stage 74 includes the transistors (e.g., MOSFET transistors) 76, 78, 80, 82, 84, 86, 88, and 90. In particular, the transistors 76, 78, 84, and 90 may be n-type transistors. Furthermore, the transistors 80, 82, 86, and 88 may be p-type transistors. The inverted clock signal CKF may be connected to a gate of the transistors 80 and 86. Additionally, the voltage source (VDD) 55 may be coupled to a source of the transistors 80 and 86.

As described with regard to FIG. 2, when the clock signal 64 is high, the transistors 54 and 56 are turned off and the transistors 58, 60, and 62 are turned on. The transistors 58 and 60 draw a differential current proportional to the potential difference between the voltage of the DQ input signal 66 and the voltage reference 68. The differential current flow due to the discharge of voltage allows the differential voltage between the node 67 and the node 69 to increase (e.g., differential gain) relative to the differential voltage between the DQ input signal 66 voltage and the voltage reference 68. That is, the differential voltage is amplified and discharges the voltages at nodes 67 and 69 to VDD. As the node 67 and the node 69 continue to discharge, transistors 76 and 78 are switched on.

However, the DQ input signal 66 may have a voltage level that is too low or too high (e.g., 100-900 millivolts) to be detected by the sensing stage 52. As such, the complimentary sensing stage 102 may assist in detecting the voltage of the DQ input signal 66. When the inverted clock signal CKF is high (e.g., when the clock signal CK 64 is low), the transistors 104, 106, and 108 are off. Nodes 109 and 111 are reset and discharged to ground through the transistors 110 and 112.

When the inverted clock signal CKF is low (e.g., when the clock signal 64 is high), the transistors 110 and 112 are turned off and the transistor 104 is turned on. The transistor 104 generates a differential current drawn by the transistors 106 and 108 that is proportional to the potential difference between the voltage of the DQ input signal 66 and the voltage reference 68. That is, the differential voltage is amplified and charges the voltages at nodes 109 and 111 to VDD. As the nodes 109 and 111 continue to charge, the transistors 76 and 78 are switched on.

The differential voltage is built up through the transistors 76 and 78 and passes to the transistors 82, 84, 88, and 90. The transistors 82, 84, 88, and 90 are regenerative circuits, creating a full rail (e.g., digital ready) output. That is, it is not necessary to buffer the signal and wait for an increase in gain before the output is passed to the rest of the circuit. It should be noted that the p-type transistors implemented in the complimentary sensing stage 102 may cause the logic of the complimentary sensing stage 102 to operate inversely of the logic of the sensing stage 52.

By employing the techniques described in the present disclosure, the systems described herein may allow for an improved dual-sensing stage dual-tail latch 100 in the I/O interface 16 with a wide input common mode swing sensing capability. The modified dual-tail latch 100 may use the sensing stage 52 and the complimentary sensing stage 102 to ensure the capture of incoming input signals with a wide input voltage swing while providing ample amplification of the input signals before passing the amplified signals to the latch 74. Furthermore, via the regenerative circuits made up of the transistors in the latch 74, the modified dual-sensing stage dual-tail latch 100 may generate a full rail (e.g., digital ready) output. By including a complimentary sensing stage 102 arranged in parallel with the original sensing stage 52 and having input transistors of opposite types (i.e., p-channel and n-channel), the improved dual-sensing stage dual-tail latch 100 provides an improved output by reducing the impact of the input transistors transitioning into a cut-off region.

While only certain features of the present disclosure have been illustrated and described herein, many modifications and changes will occur to those skilled in the art. For example, signal polarity for assertions may be inverted for at least some signals where a logic low is an assertion while a logic high is a de-assertion. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A device comprising:
an interface configured to receive one or more clock signals and one or more data signals; and
a dual-sensing stage dual-tail latch arranged at the interface and comprising:
a sensing stage configured to sense a differential voltage between a first signal and a second signal and to provide a first differential voltage output and a second differential voltage output to a first node and a second node, respectively;
a complimentary sensing stage arranged in parallel with the sensing stage and configured to sense the differential voltage between the first signal and the second signal, wherein a first complimentary differential output voltage and a second complimentary differential output of the complimentary sensing stage are coupled to the first node and the second node; and
a latch stage configured to receive the outputs from the first node and the second node.

2. The device of claim 1, wherein the complimentary sensing stage comprises input transistors of a type opposite to a type of input transistors of the sensing stage.

3. The device of claim 2, wherein the latch stage comprises input transistors having a type that is the same as the type of input transistors of the sensing stage.

4. The device of claim 2, wherein the type of input transistors is one of n-type transistor or p-type transistor.

5. The device of claim 1, wherein the sensing stage and the complimentary sensing stage are each clocked by the same clock signal of the one or more clock signals.

6. The device of claim 1, wherein the first signal is a data (DQ) signal and the second signal is a reference voltage.

7. The device of claim 1, wherein the sensing stage and the complimentary sensing stage are each configured to amplify the differential voltage between the first signal and the second signal.

8. The device of claim 1, wherein the complimentary sensing stage is clocked with a delay based on the one or more clock signals.

9. A system, comprising:
one or more external devices configured to generate one or more data signals; and
a memory device coupled to the one or more external devices, wherein the memory device comprises:
an input/output (I/O) interface configured to receive one or more clock signals and the one or more data signals, wherein the I/O interface comprises:
a dual-sensing stage dual-tail latch, comprising:
a sensing stage configured to sense a differential between a first signal and a second signal and to provide a first differential output and a second differential output to a first node and a second node, respectively;
a complimentary sensing stage arranged in parallel with the sensing stage and configured to sense a differential between the first signal and the second signal, wherein a first complimentary differential output and a second complimentary differential output of the complimentary sensing stage are coupled to the first node and the second node; and
a latch stage configured to latch the outputs received from the sensing stage and the complimentary sensing stage at the first node and the second node, in response to at least one of the one or more clock signals.

10. The system of claim 9, wherein the first signal is a data (DQ) signal of the one or more data signals and the second signal is a reference voltage.

11. The system of claim 9, wherein:
the sensing stage is configured to amplify the first differential output and the second differential output prior to the latch stage receiving the differential output; and
the complimentary sensing stage is configured to amplify the first complimentary differential output and the second complimentary differential output prior to the latch stage receiving the differential output.

12. The system of claim 9, wherein the sensing stage is clocked by a first clock signal of the one or more clock signals and the complimentary sensing stage is clocked by a second clock signal of the one or more clock signals, wherein the second clock signal is an inversion of the first clock signal.

13. The system of claim 9, wherein the latch stage is configured to provide a full rail output based on the outputs from the first node and the second node.

14. The system of claim 9, wherein the complimentary sensing stage comprises input transistors of a type opposite to a type of input transistor of the sensing stage, wherein the type of input transistor is a n-type transistor or a p-type transistor.

15. A memory device, comprising:
a dual-sensing stage dual-tail latch arranged at an interface of the memory device and comprising:
a sensing stage comprising one or more n-type input transistors configured to:

sense a differential voltage between a first signal and a second signal;
amplify the differential voltage; and
provide the amplified differential voltage to a first node and a second node;
a complimentary sensing stage comprising one or more p-type transistors configured to:
sense a complimentary differential voltage between the first signal and the second signal;
amplify the complimentary differential voltage; and
provide the amplified complimentary differential voltage to the first node and the second node; and
a latch stage configured to receive the amplified differential voltage or the amplified complimentary differential voltage from the first node and the second node.

16. The memory device of claim 15, wherein the complimentary sensing stage is arranged in parallel with the sensing stage.

17. The memory device of claim 15, where the latch stage comprises n-type input transistors.

18. The memory device of claim 17, wherein the input transistors of the latch stage are regenerative circuits and generate a full-rail output.

19. The memory device of claim 15, wherein the sensing stage and the complimentary sensing stage each receive the same clock signal of the one or more clock signals.

20. The memory device of claim 15, wherein a first position of the sensing stage and a second position of complimentary sensing stage are reversed relative to the latch stage.

* * * * *